United States Patent
Hwang

(10) Patent No.: US 7,018,750 B2
(45) Date of Patent: Mar. 28, 2006

(54) MASK AND METHOD FOR CRYSTALLIZING AMORPHOUS SILICON

(75) Inventor: Kwang-Jo Hwang, Kyonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/677,252

(22) Filed: Oct. 3, 2003

(65) Prior Publication Data
US 2004/0076894 A1   Apr. 22, 2004

(30) Foreign Application Priority Data
Oct. 4, 2002 (KR) .................. 10-2002-0060705

(51) Int. Cl.
*G01F 9/00* (2006.01)
(52) U.S. Cl. ........................................... 430/5
(58) Field of Classification Search .............. 430/5, 430/296; 250/492.2; 438/486–488
See application file for complete search history.

(56) References Cited

U.S. PATENT DOCUMENTS

| 5,656,397 | A | * | 8/1997 | Imai et al. ................ 430/5 |
| 6,503,668 | B1 | * | 1/2003 | Inazuki et al. ............ 430/5 |
| 6,734,635 | B1 | * | 5/2004 | Kunii et al. ........... 315/169.3 |
| 2004/0126674 | A1 | * | 7/2004 | Taniguchi et al. ......... 430/5 |

FOREIGN PATENT DOCUMENTS

JP          06-163590          6/1994
KR          2000-001170        1/2000

OTHER PUBLICATIONS

Y. Sano, et al., "Highly Packed and Ultra-Large Si Grains Grown by a Single-shot Irradiation of Excimer-Laser Light Pulse", Department of Physical Electronics, Tokyo Institute of Technology, (2001) 8 pages.*
Robert S. Sposili et al., "Single-Crystal Si Films Via A Low-Substrate-Temperature Excimer-Laser Crystallization Method," Im. Mat. Res. Soc. Symp. Proc., vol. 452, pp. 953-958.

* cited by examiner

*Primary Examiner*—S. Rosasco
(74) *Attorney, Agent, or Firm*—McKenna Long & Aldridge LLP

(57) ABSTRACT

A method of crystallizing amorphous silicon includes forming an amorphous silicon layer on a substrate, placing a mask over the substrate including the amorphous silicon layer, and applying a laser beam onto the amorphous silicon layer through the mask to form a first crystallized region, the laser beam having an energy intensity high enough to completely melt the amorphous silicon layer, wherein the mask comprises a base substrate, a phase shift layer on the base substrate, having a plurality of first stripes having a first width separated by slits, and a blocking layer overlapping the phase shift layer, having a plurality of second stripes having a second width narrower than the first width, the second stripes being parallel to the first stripes.

8 Claims, 9 Drawing Sheets

MASK AND METHOD FOR CRYSTALLIZING AMORPHOUS SILICON

This application claims the benefit of the Korean Patent Application No. P2002-060705 filed on Oct. 4, 2002, which is hereby incorporated by reference.

BACKGROUND OF THE INVENTION

1. Field of the Invention

The present invention relates to a crystallizing method, and more particularly, to a mask and method for crystallizing amorphous silicon. Although the present invention is suitable for a wide scope of applications, it is particularly suitable for improving fabrication productivity.

2. Discussion of the Related Art

A liquid crystal display (LCD) device has been in the spotlight as a next generation high value display device because of its low power consumption and portability.

The liquid crystal display device is composed of an array substrate including thin film transistors, a color filter substrate, and a liquid crystal layer interposed between an array substrate and a color filter substrate. The liquid crystal display device displays images by using transmittance of light depending on the anisotropic refractive index of the liquid crystal layer.

An active matrix liquid crystal display (AMLCD) device, which includes a thin film transistor at each pixel as a switching device, has been widely used due to its high resolution and fast moving images.

In general, silicon has been used as an active layer of the thin film transistor. Especially, since polycrystalline silicon has a high field effect mobility and is optically stable, it has been widely used as an active layer of a thin film transistor for a liquid crystal display device having driving circuits and thin film transistors on the same substrate or for a display device that is much exposed to light.

Polycrystalline silicon may be formed through a high temperature process or a low temperature process. The high temperature process may be accomplished under the temperatures of about 1,000 degrees Celsius, which are much higher than the transition temperature of an insulating substrate, such as a glass substrate. Therefore, the high temperature process requires a quartz substrate that has a high heat resistance. However, the quartz substrate may not be cost effective for a substrate of thin film transistors. In addition, a polycrystalline silicon layer formed through the high temperature process has a high surface roughness and comprises fine grains.

Accordingly, a method of forming polycrystalline silicon, which includes depositing amorphous silicon that can be formed under low temperature conditions and crystallizing the amorphous silicon, has been researched and developed. The method of forming polycrystalline silicon includes a laser annealing method and a metal induced crystallization method.

Among these methods, in the laser annealing method, pulses of laser beams are irradiated on a substrate including an amorphous silicon layer, and melting and solidification of the irradiated amorphous silicon layer are repeatedly accomplished in 10 to $10^2$ nanoseconds. Thus, damage to the substrate under the silicon layer may be minimized.

A method of crystallizing amorphous silicon will be described in detail with reference to the attached drawings.

FIG. 1 is a graph showing an energy intensity of a laser beam versus a grain size of crystallized silicon in a laser annealing method.

In FIG. 1, a first region of the graph is a partial melting regime. Only the surface of a silicon layer is melted by the energy intensity of the first region, thereby forming small grains.

A second region of the graph is a near-complete melting regime. Grains formed in the second region are larger than those in the first region because the grains laterally grow. However, sizes of the grains are non-uniform.

A third region of the graph is a complete melting regime, wherein an amorphous silicon layer is entirely melted by the energy intensity of the third region and fine grains are formed due to homogeneous nucleation.

Thus, in the laser annealing method, in order to form uniform and large grains, the energy intensity of the second region may be used, and irradiation times and overlapping ratios of the laser beams may be controlled.

Generally, grain boundaries of polycrystalline silicon interfere with currents and lowers the reliability of a thin film transistor. In addition, a breakdown of an insulating layer may occur because of a collision of electrons and a deterioration in the grains.

Accordingly, the formation of single crystalline silicon is important, and recently, a sequential lateral solidification (SLS) method has become of interest to solve the above problems. The SLS method takes advantage of the fact that silicon grains grow laterally from the boundary between the liquid silicon and the solid phase silicon. The SLS method can increase the size of the silicon grains by controlling the energy intensity of a laser beam and the irradiation range of the laser beam. The SLS method is disclosed in Robert S. Sposilli, M. A. Crowder, and James S. Im, Mat. Res. Soc. Symp. Proc. Vol. 452, 956~957, 1997. TFTs having channel areas of single crystalline silicon can be formed by the SLS method.

FIG. 2 is a schematic view showing the SLS crystallizing method using a laser annealing process according to the related art. In FIG. 2, a crystallizing mask 14, which includes slits 12 spaced apart from each other, is disposed over a silicon layer 10 of an amorphous phase. A laser beam 16 is irradiated on portions A of the silicon layer 10 through the slits 12 of the crystallizing mask 14. The laser beam 16 has an energy intensity that can completely melt the silicon layer 10 exposed to the laser beam 16. Thus, the portions A of the silicon layer 10 corresponding to the slits 12 are completely melted. Then, a plurality of grains 18 grow laterally from the boundaries of the melted portions A of the silicon layer 10, and the growth of the grains 18 stop at region B where the grains 18 meet each other. A width from one boundary of the portion A to the region B where the growth of the grains 18 stop may be referred to as length L of the grain 18.

Although not shown in FIG. 2, the crystallizing mask 14 can be moved laterally so that the slit 12 may overlap one of the boundaries of the portion A. A laser beam is irradiated on the next portion of the silicon layer 10, which overlaps the portion A, and the next portion is crystallized. Thus, larger grains are formed by repeatedly accomplishing the above processes.

The processes are performed until the length of the grain is about 10 micrometers (μm), and the silicon layer including the grains may be used as an active layer of a thin film transistor, which has a channel of about 6 micrometers (μm) in width.

FIG. 3 schematically shows a mask for crystallizing according to the related art.

As shown in FIG. 3, a plurality of blocking layers 22 spaced apart from each other is formed on a base substrate 20. Spaces between the blocking layers 22 are defined as slits 24. The base substrate 20 may be formed of quartz, and the blocking layers 22 may be formed of chromium (Cr), which reflects a laser beam. The blocking layers 22 may have a width of about 4 micrometers (μm), and the slits 24 may have a width of about 2 micrometers (μm).

FIG. 4 shows overlaps between shots of a laser beam in the SLS crystallizing process using the mask of FIG. 3. A profile of the laser beam at each shot relates to an energy intensity of the laser beam. FIG. 4 illustrates the region corresponding to only two slits of the mask for simplicity.

As shown in FIG. 4, a first laser shot is irradiated on the substrate 28 including an amorphous silicon layer 26 thereon, and a beam passing through the mask has two peaks corresponding to the slits. Second, third, and fourth laser shots are subsequently irradiated such that peaks of each laser shot overlap each other. At this time, the peaks overlap each other such that the overlapping portions between the peaks can have energy intensities higher than the melting point of the silicon layer 26.

The peaks of the first laser shot to the fourth laser shot overlap each other with a fixed width because a position of the substrate 20 corresponding to the slit of the mask changes by moving the substrate in a first direction in FIG. 4. In FIG. 4, a second direction, which is opposite to the first direction, indicates the growing direction of the grains.

Although not shown in FIG. 4, distance C between the two peaks of the first laser shot is closely connected to the width of the blocking layer 22 of the mask 20 of FIG. 3 (i.e., a space between the slits 24 of FIG. 3). Since the peaks of each laser shot must have the distance C therebetween to prevent them from overlapping each other, there is a limitation in reducing the width of the blocking layer 22 under 4 micrometers (μm) according to the structure of the mask of the related art.

More particularly, in the SLS crystallizing process using the mask of the related art, if the peaks of a laser shot overlap each other, the silicon layer is melted non-uniformly because an overlapping portion between the peaks is large, and thus the grains do not grow completely. In addition, since a nucleation region is formed in the overlapping portion, characteristics of crystallization get worse. Therefore, the width of the blocking layer, that is, the space between the slits must be more than at least 4 micrometers (μm) so that the peaks of each laser shot do not overlap each other, thereby providing a reliable process. However, there is a disadvantage in that the efficiency of the process is lowered due to an increase in the laser shots.

SUMMARY OF THE INVENTION

Accordingly, the present invention is directed to a mask and method for crystallizing amorphous silicon that substantially obviates one or more of problems due to limitations and disadvantages of the related art.

Another object of the present invention is to provide a mask and method for crystallizing amorphous silicon to form polycrystalline silicon having large grains.

A further object of the present invention is to provide a mask and method for crystallizing amorphous silicon for a reduced number of processes.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of crystallizing amorphous silicon includes forming an amorphous silicon layer on a substrate, placing a mask over the substrate including the amorphous silicon layer, and applying a laser beam onto the amorphous silicon layer through the mask to form a first crystallized region, the laser beam having an energy intensity high enough to completely melt the amorphous silicon layer, wherein the mask comprises a base substrate, a phase shift layer on the base substrate, having a plurality of first stripes having a first width separated by slits, and a blocking layer overlapping the phase shift layer, having a plurality of second stripes having a second width narrower than the first width, the second stripes being parallel to the first stripes.

In another aspect of the present invention, a mask for crystallizing amorphous silicon includes a base substrate, a phase shift layer on the base substrate, having a plurality of first stripes having a first width separated by slits, and a blocking layer overlapping the phase shift layer, having a plurality of second stripes having a second width narrower than the first width, the second stripes being parallel to the first stripes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
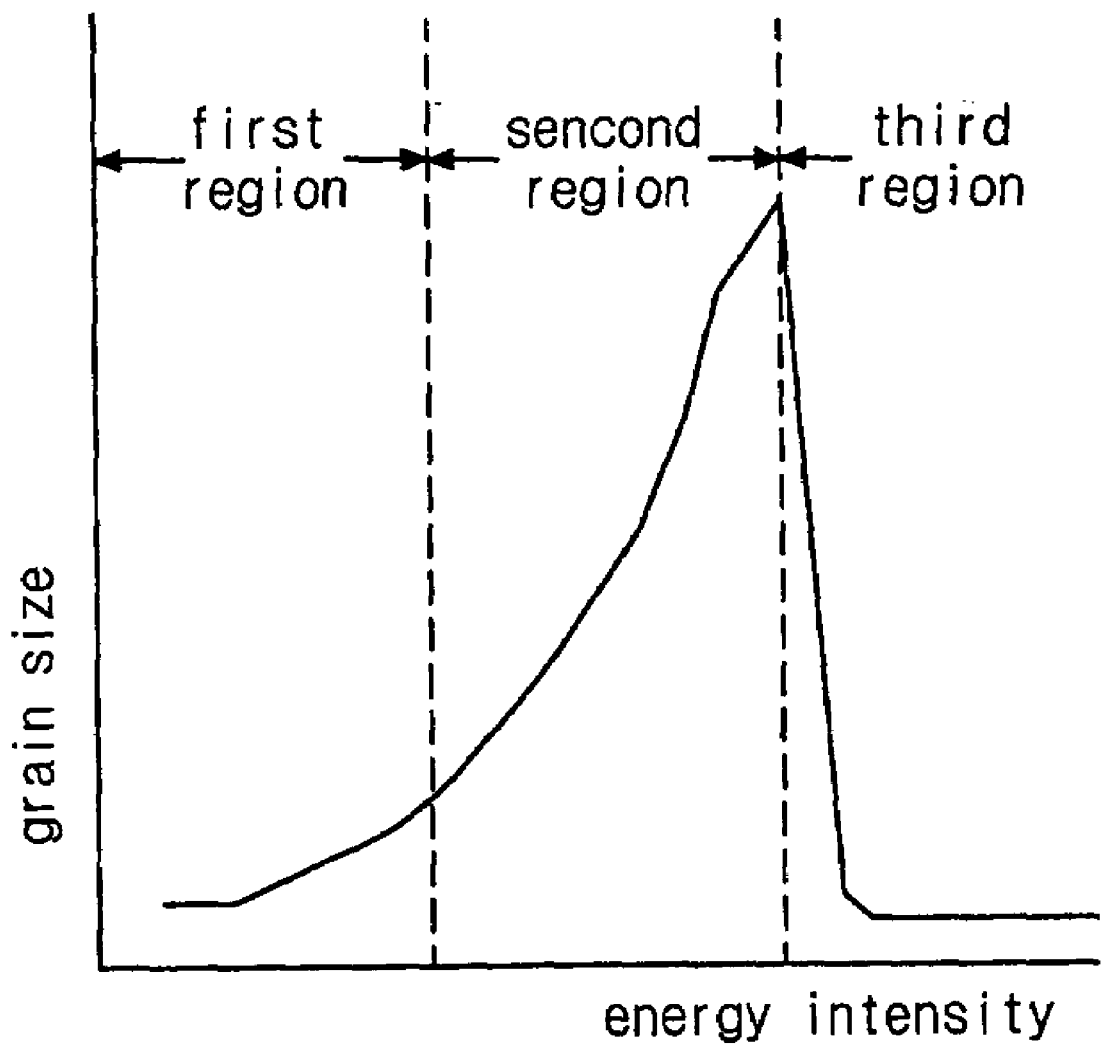
FIG. 1 is a graph showing an energy intensity of a laser beam versus a grain size of crystallized silicon in a laser annealing method.
Figure 2:
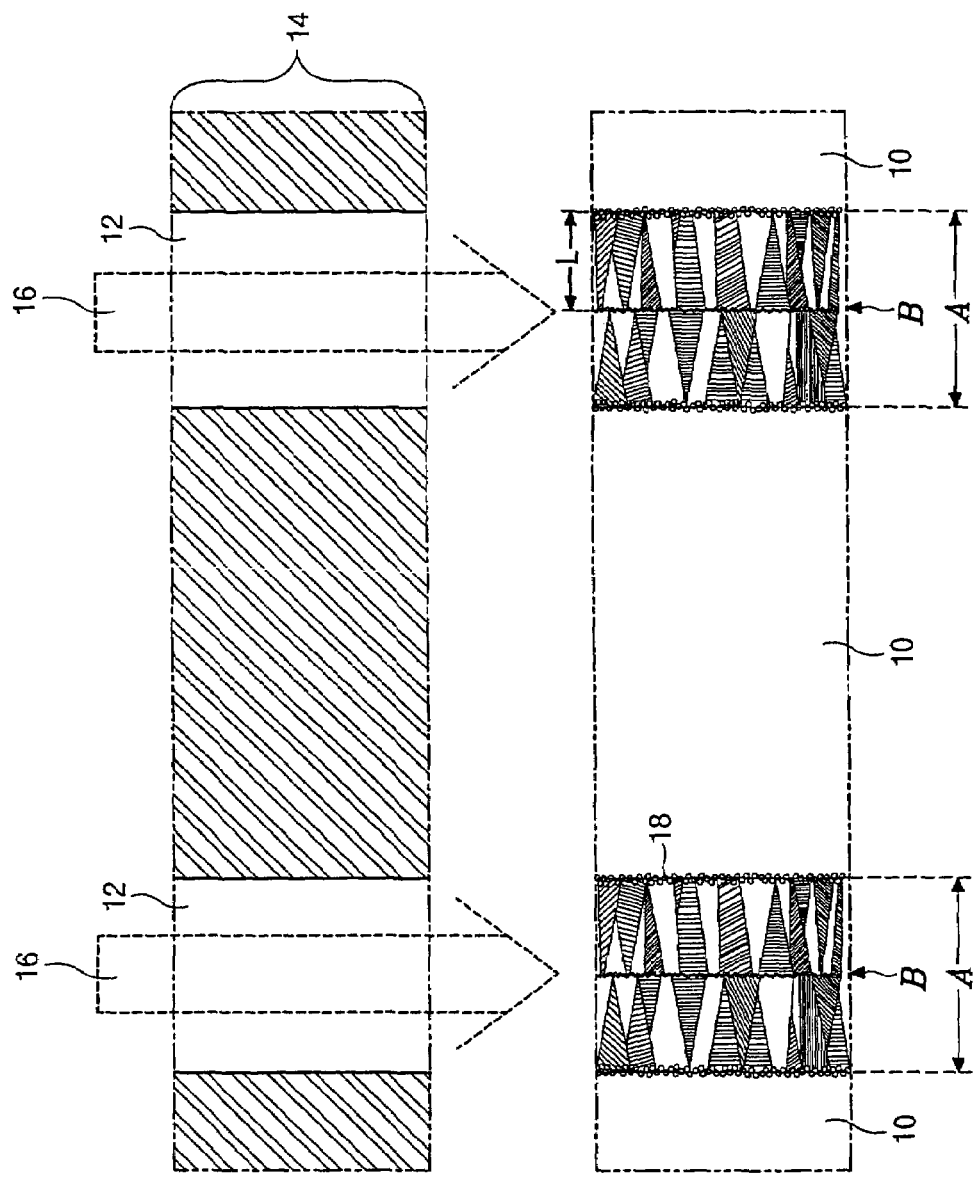
FIG. 2 is a schematic view showing the sequential lateral solidification (SLS) crystallizing method using a laser annealing process according to the related art.
Figure 3:
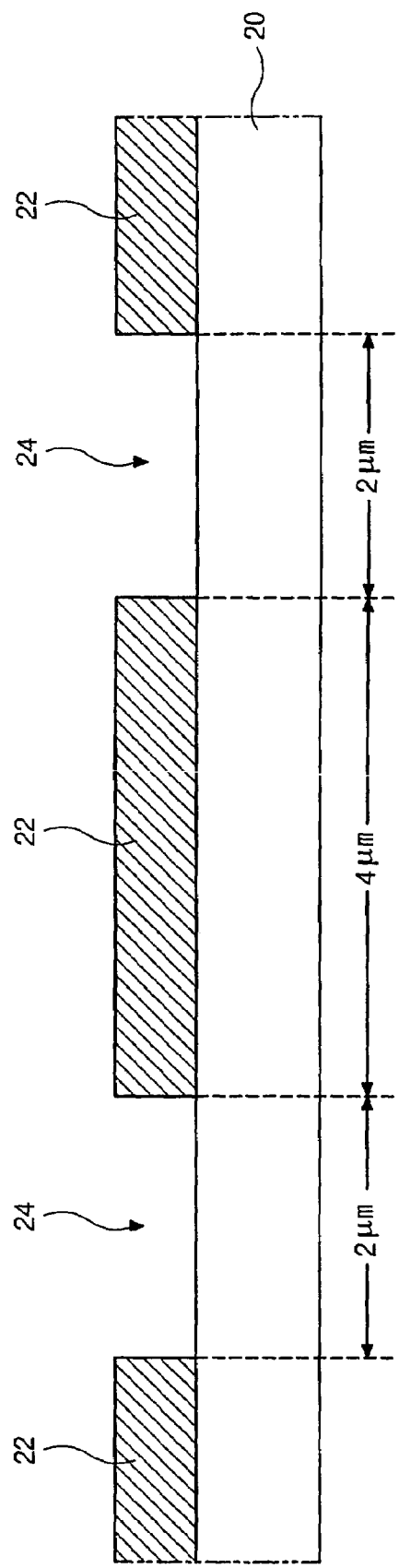
FIG. 3 is a schematic cross-sectional view showing a mask for crystallization according to the related art.
Figure 4:
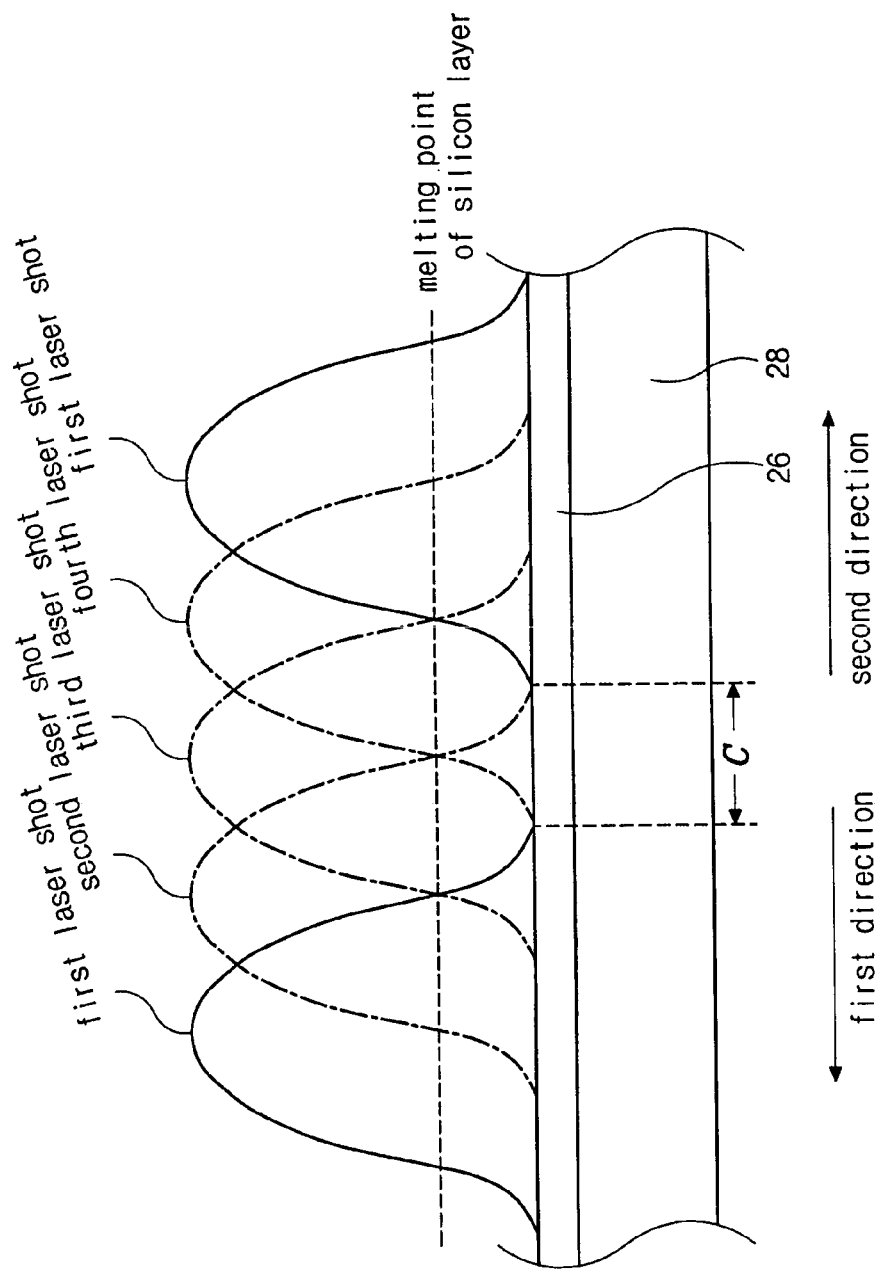
FIG. 4 is a schematic view showing overlaps between shots of a laser beam in the SLS crystallizing method using the mask of FIG. 3.
Figure 5:
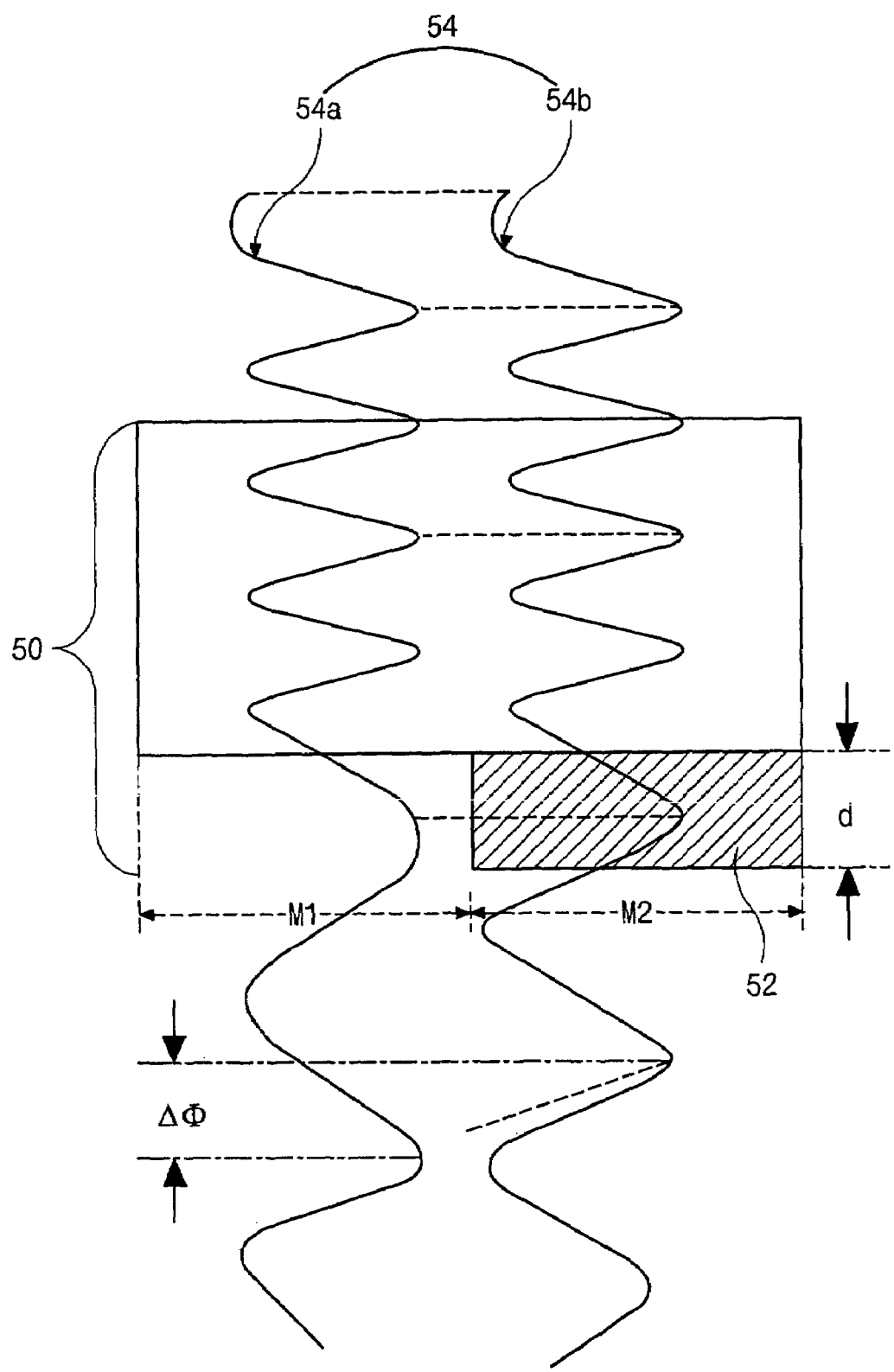
FIG. 5 is a schematic view illustrating the principle of phase shift in a mask according to the present invention.

FIG. 5 is a schematic view illustrating the principle of phase shift in a mask according to the present invention.

In FIG. 5, a first part 54a of a laser beam 54 passes through a first portion M1 of a mask 50, where there is no layer, and a second part 54b of the laser beam 54 permeates a second portion M2 of the mask 50, where there exists a phase shift layer 52. Since the first part 54a and the second part 54b of the laser beam 54 go through different optical paths according to the existence of the phase shift layer 52, there is a phase difference ΔΦ between the first part 54a and the second part 54b passing through the mask 50. The phase difference ΔΦ is expressed as the following equation:

$$\Delta\Phi = 2\pi \cdot d(n-1) \cdot \lambda,$$

wherein, λ represents a wavelength of a light source, n is a refractive index of the phase shift layer 52, and d represents a thickness of the phase shift layer 52.

Thus, from the above equation, the phase of light can be shifted by about 180 degrees, for example, by controlling the thickness d of the phase shift layer 52.

Figure 6:
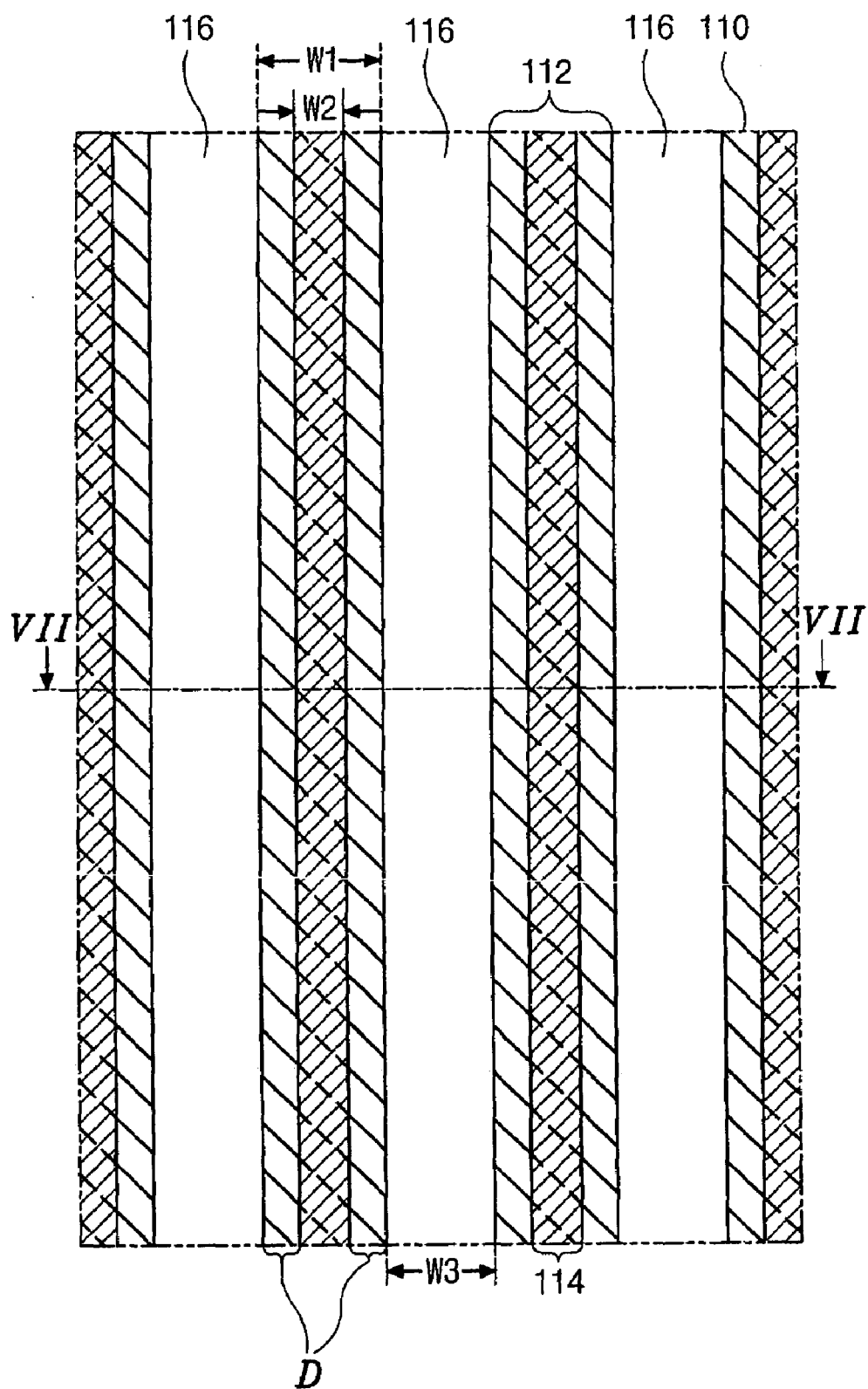
FIG. 6 is a plane view of a mask for crystallizing amorphous silicon according to the present invention.

FIG. 6 is a plane view of a mask for crystallizing amorphous silicon according to the present invention. In FIG. 6, a phase shift layer 112 is formed in a first direction on a base substrate 110. The phase shift layer 112 includes a plurality of first stripes, each of which has a first width W1. A blocking layer 114 is formed in the first direction, overlapping the phase shift layer 112. The blocking layer 114 includes a plurality of second stripes, each of which has a second width W2. Spaces between adjacent phase shift layers 112 become a plurality of slits 116, and each slit 116 has a third width W3.

Here, the second width W2 is narrower than the first width W1, thereby exposing both sides D of each first stripe of the phase shift layer 112. The exposed sides D of the phase shift layer 112 causes a phase shift of a laser beam passing therethrough when the laser beam is irradiated, and thus profiles of the laser beam passing through the mask can have a stiff slope.

The first width W1 may generally be twice as wide as the third width W3 in the related art. However, the first width W1 may be smaller than or equal to the third width W3 in the present invention.

The mask of the present invention may be used for excimer laser.

Figure 7:
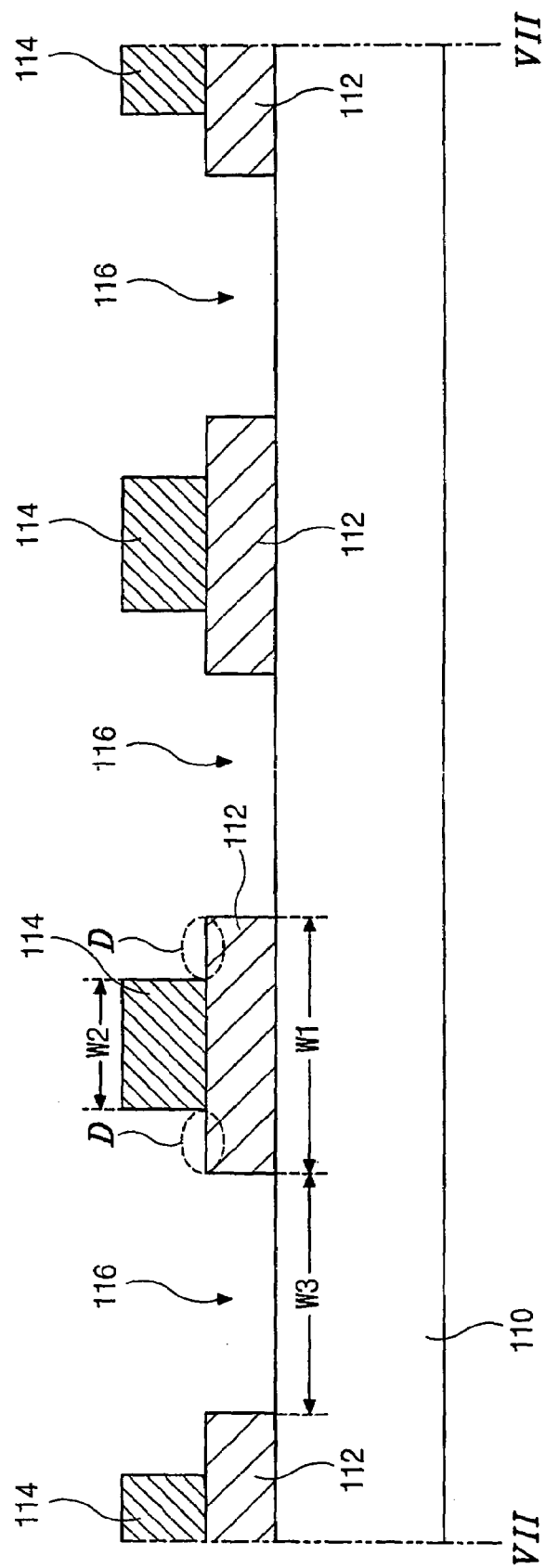
FIG. 7 is a cross-sectional view taken along line VII—VII of FIG. 6.

FIG. 7 is a cross-sectional view taken along line VII—VII of FIG. 6.

As shown in FIG. 7, the phase shift layer 112, which includes the plurality of first stripes, is formed on the base substrate 110 such that the first stripes are spaced apart from each other, and each first stripe has the first width W1. The blocking layer 114, which includes the plurality of second stripes having the second width W2, is formed on the phase shift layer 112, wherein the second width W2 is narrower than the first width W1, thereby exposing both sides D of each first stripe of the phase shift layer 112 by the blocking layer 114. The spaces between the first stripes of the phase shift layer 112 become the slits 116. The slits 116 have the third width W3.

The phase shift layer 112 may be formed of a material that can reverse the phase of light, such as $MoSi_x$ (molybdenum-silicide). The base substrate 110 may be formed of a high heat-resistant material, such as quartz, and the blocking layer 114 may be formed of a material that can block a light passage, such as chromium (Cr).

In the mask of the present invention, the third width W3 of the slit 116 may be within the range of about 1 to 3 micrometers (μm), and the first width W1 of the phase shift layer 112 may be also within the range of about 1 to 3 micrometers (μm). It may be beneficial that the third width W3 and the first width W1 are about 2 micrometers (μm). Accordingly, in the present invention, the resolution of the mask for crystallizing can be improved due to a destructive interference of the beam profile by using the phase shift layer without changing the optical compensating apparatus for controlling the laser beam. Therefore, productivity in the SLS crystallizing method can be increased due to the mask having an improved resolution.

The exposed sides D of the phase shift layer 112 should have sizes enough so that the transmitted laser beam is reversed to have energy intensities larger than the melting point of a silicon layer.

Figure 8:
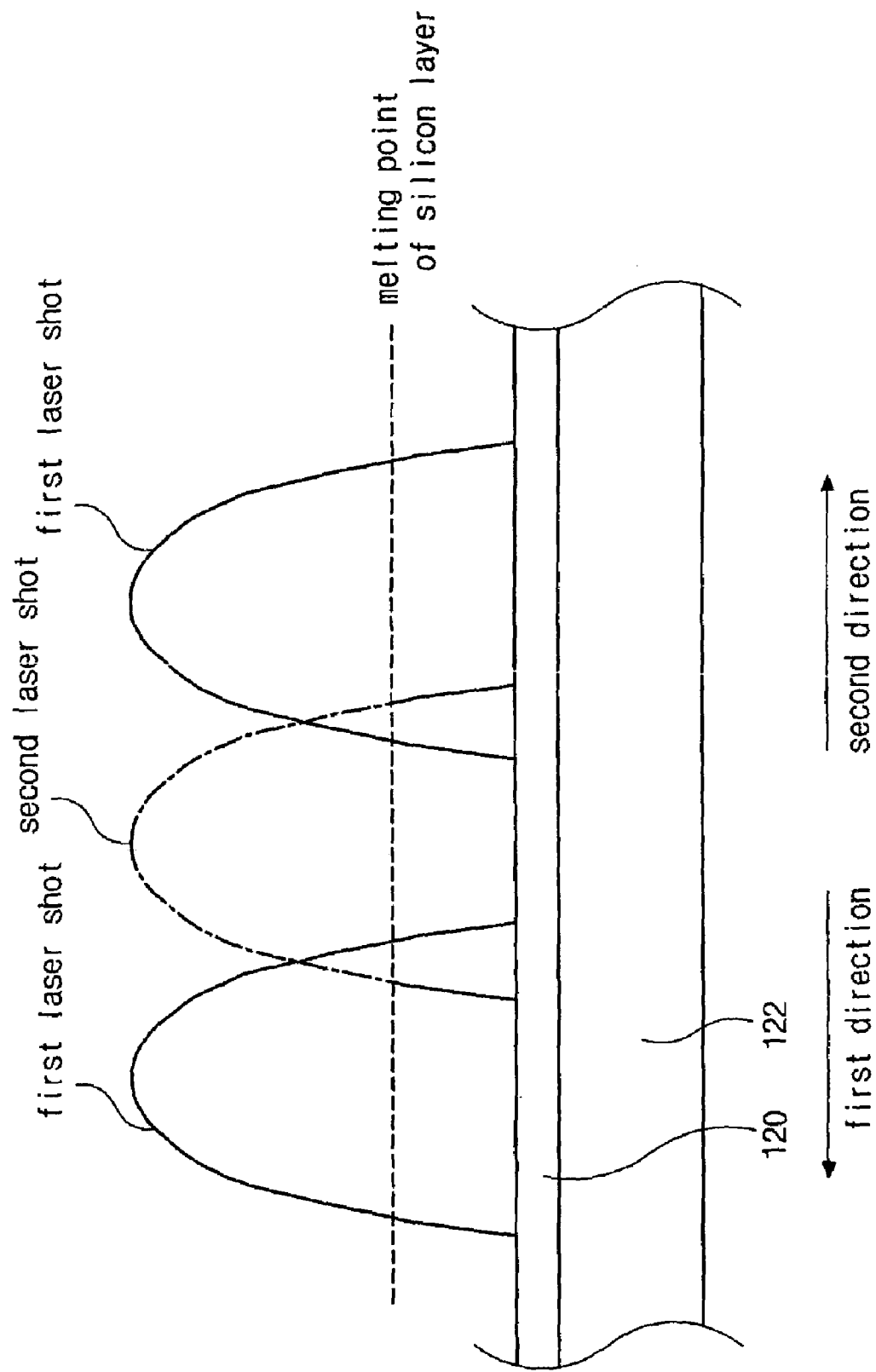
FIG. 8 is a schematic view showing the energy intensity profiles of a laser beam irradiated through the mask of the present invention.

FIG. 8 is a schematic view showing energy intensity profiles of a laser beam irradiated through the mask of the present invention.

In FIG. 8, a first laser shot is irradiated on a substrate 122 including an amorphous silicon layer 120 formed thereon, and a beam passing through the mask has two peaks, which corresponds to the slits of the mask. The peaks are spaced apart from each other without overlapping each other. Next, a second laser shot is irradiated, wherein a peak of the second laser shot overlaps the two peaks of the first laser shot.

In the SLS crystallizing method of the present invention, peaks of each laser shot do not overlap each other because profiles of the laser beam passing through the mask have stiff slopes due to destructive interference by using the phase shift layer. Therefore, the number of laser shots is decreased as compared to that in the related art. In addition, since the distance between the slits can be reduced and the number of slits can be increased, the resolution of the mask for crystallizing can be improved.

Accordingly, although the mask may have the resolution of about 2 micrometers (μm), for example, the profiles of the laser beam do not overlap each other, and thus the growth of grains can be stable and reproducible.

In the present invention, the number of laser shots is not limited to two but decreased as opposed to the related art, thereby improving productivity of the SLS crystallizing process.

Figure 9:
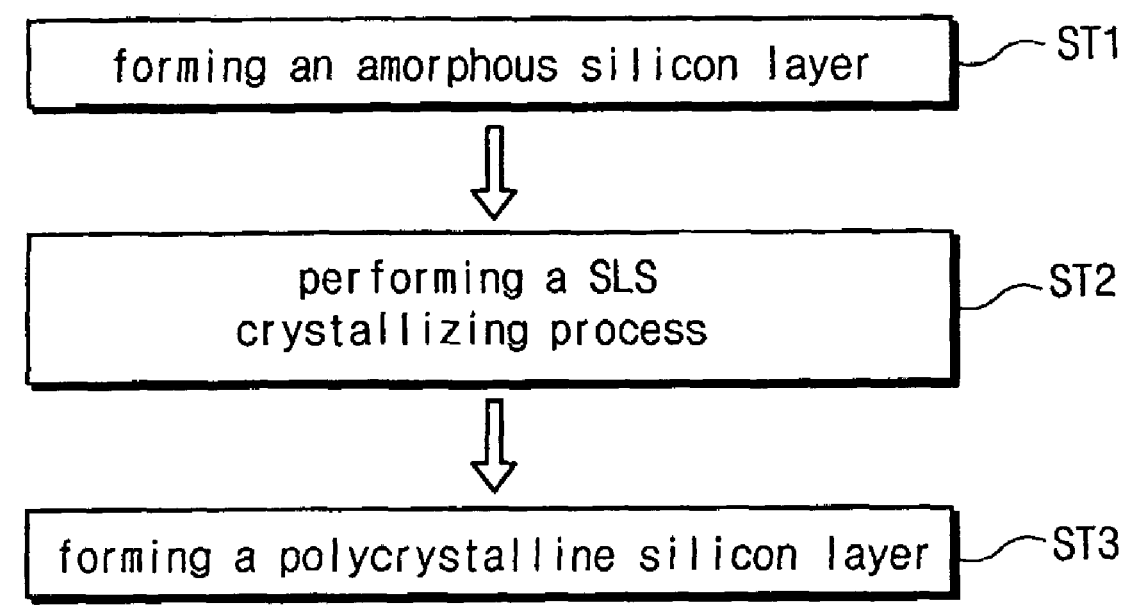
FIG. 9 is a flow chart showing the SLS crystallizing method using the mask of the present invention.

FIG. 9 is a flow chart showing a SLS crystallizing process using the mask of the present invention.

In step ST1, an amorphous silicon layer is formed by depositing amorphous silicon on an insulating substrate and dehydrogenating the amorphous silicon to improve crystallizing characteristics. Here, a buffer layer may be formed between the substrate and the amorphous silicon layer. The buffer layer may be formed of an insulating material such as silicon oxide ($SiO_2$).

In step ST2, the SLS crystallizing process is performed by using a laser. That is, a first shot of a laser beam is irradiated on the substrate including the amorphous silicon layer by using the mask having a phase shift layer, and a portion exposed to the laser beam is melted. Grains grow from the boundaries of the melted portion toward the middle of the melted portion, and thus a first crystallized region is formed. The next shot is irradiated, so that the transmitted laser beam overlaps the first crystallized region. Thus, a second crystallized region is formed.

In step ST3, a polycrystalline silicon layer is formed by repeatedly performing step ST2.

In the mask of the present invention, the blocking layer that is formed of chromium reflects the laser beam, and the phase shift layer formed of molybdenum silicide reverses the phase of the laser beam, reducing the intensity of the laser beam. Therefore, peaks of a laser shot can be separated without difficulty.

Additionally, the resolution of the mask for crystallizing can be improved, and thus productivity of the SLS crystallizing process can be increased.

It will be apparent to those skilled in the art that various modifications and variations can be made in the mask and method for crystallizing amorphous silicon of the present invention without departing from the spirit or scope of the inventions. Thus, it is intended that the present invention covers the modifications and variations of this invention provided they come within the scope of the appended claims and their equivalents.

What is claimed is:

1. A mask for crystallizing amorphous silicon using a sequential lateral solidification (SLS) method, comprising:
    a base transparent substrate;
    a phase shift layer on the base substrate, having a plurality of first stripes having a first width separated by slits, wherein the slits are transparent; and
    a blocking layer overlapping the phase shift layer, having a plurality of second stripes having a second width narrower than the first width, the second stripes being parallel to the first stripes,
    wherein the first width is smaller than or equal to a width of each slit.

2. The mask according to claim 1, wherein the phase shift layer is capable of reversing a phase of light.

3. The mask according to claim 2, wherein the phase shift layer is formed of molybdenum silicide (MoSix).

4. The mask according to claim 1, wherein the blocking layer is capable of reflecting a laser beam.

5. The mask according to claim 4, wherein the blocking layer is formed of chromium (Cr).

6. The mask according to claim 1, wherein each of the slits has a width within a range of about 1 to 3 micrometers (μm).

7. The mask according to claim 1, wherein the first width is in the range of about 1 to 3 micrometers (μm).

8. The mask according to claim 1, wherein each of the second stripes of the blocking layer is disposed over the middle of each of the first stripes of the phase shift layer, thereby exposing both sides of each first stripe.

* * * * *